(12) United States Patent
Chen et al.

(10) Patent No.: US 11,694,933 B2
(45) Date of Patent: Jul. 4, 2023

(54) METHODS OF FORMING METAL GATE SPACER

(71) Applicant: Taiwan Semiconductor Manufacturing Co., Ltd., Hsin-Chu (TW)

(72) Inventors: Yen-Ting Chen, Taichung (TW); Yi-Hsiu Liu, Taipei (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 456 days.

(21) Appl. No.: 16/218,330

(22) Filed: Dec. 12, 2018

(65) Prior Publication Data

US 2020/0006158 A1    Jan. 2, 2020

Related U.S. Application Data (60) Provisional application No. 62/691,092, filed on Jun. 28, 2018.

(51) Int. Cl.
| | |
|---|---|
| *H01L 21/8238* | (2006.01) |
| *H01L 29/78* | (2006.01) |
| *H01L 29/66* | (2006.01) |
| *H01L 27/092* | (2006.01) |

(52) U.S. Cl.
CPC ........ *H01L 21/823864* (2013.01); *H01L 21/823821* (2013.01); *H01L 21/823878* (2013.01); *H01L 27/0924* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Aaron J Gray
*Assistant Examiner* — Christopher A Culbert
(74) *Attorney, Agent, or Firm* — Haynes and Boone, LLP (57) ABSTRACT

A method includes providing dummy gate structures disposed over a device region and over an isolation region adjacent the active region, first gate spacers disposed along sidewalls of the dummy gate structures in the active region, and second gate spacers disposed along sidewalls of the dummy gate structures in the isolation region, removing top portions of the second, but not the first gate spacers, forming a first dielectric layer over the first gate spacers and remaining portions of the second gate spacers, replacing the dummy gate structures with metal gate structures after the forming of the first dielectric layer, removing the first gate spacers after the replacing of the dummy gate structures, and forming a second dielectric layer over top surfaces of the metal gate structures and of the first dielectric layer.

20 Claims, 10 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2019/0172752 A1* | 6/2019 | Hsu .................. H01L 29/66795 |

* cited by examiner

METHODS OF FORMING METAL GATE SPACER

PRIORITY DATA

This application claims priority to U.S. Provisional Patent Application Ser. No. 62/691,092 filed on Jun. 28, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, many methods have been developed to introduce structural features to fin-like FETs (FinFETs) for improved device performance. While these methods have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-line FETs (FinFETs). It is an objective of the present disclosure to provide high-k metal gate spacers and methods of making the same during FinFET processes.

During fabrication of a FinFET structure, air gap may be formed in place of gate spacer disposed on sidewalls of gate structures (e.g., high-k metal gate structures (HKMGs)). In some embodiments, air gap formed between gate structures and additional dielectric layers in active device regions decrease capacitance of the gate structures, thereby improving the overall performance of the FinFET structure. However, when air gap is formed on sidewalls of gate structures disposed in an isolation region adjacent the active device region, structural complications may be introduced as a result. For example, due to difference in height between gate structures formed in the isolation region and the active device region, aspect ratio of an air gap formed in the isolation region may be greater than that of an air gap formed in the active device region. Such difference may lead to collapse of the gate structures and may in turn cause shorting issues between the gate structures and other conductive components (e.g., source/drain contacts) of the device. For this and other reasons, improvements in the formation of air gap are desired.

Figure 1A:
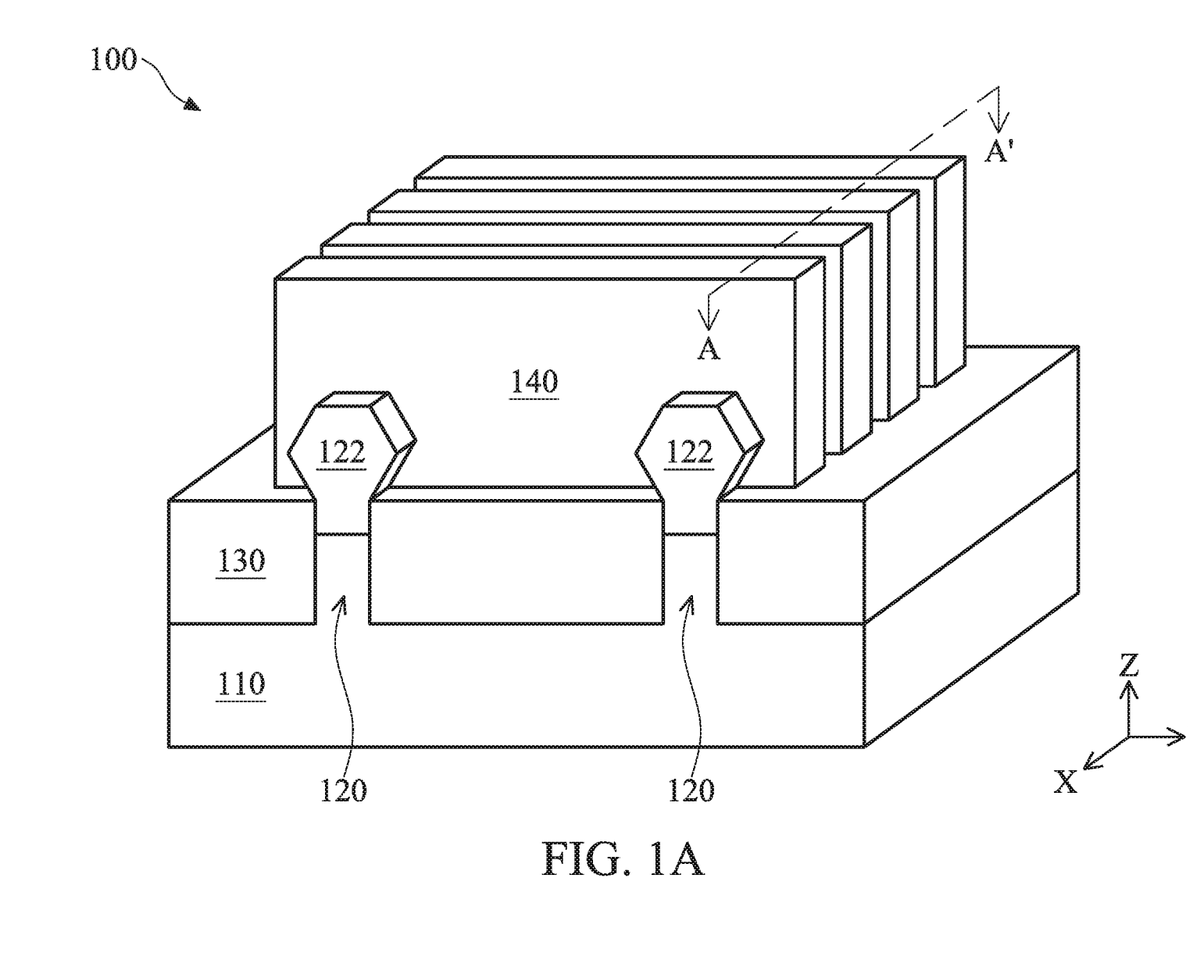
FIG. 1A is a perspective view of an embodiment of a semiconductor device according to various aspects of the present disclosure.
Figure 1B:
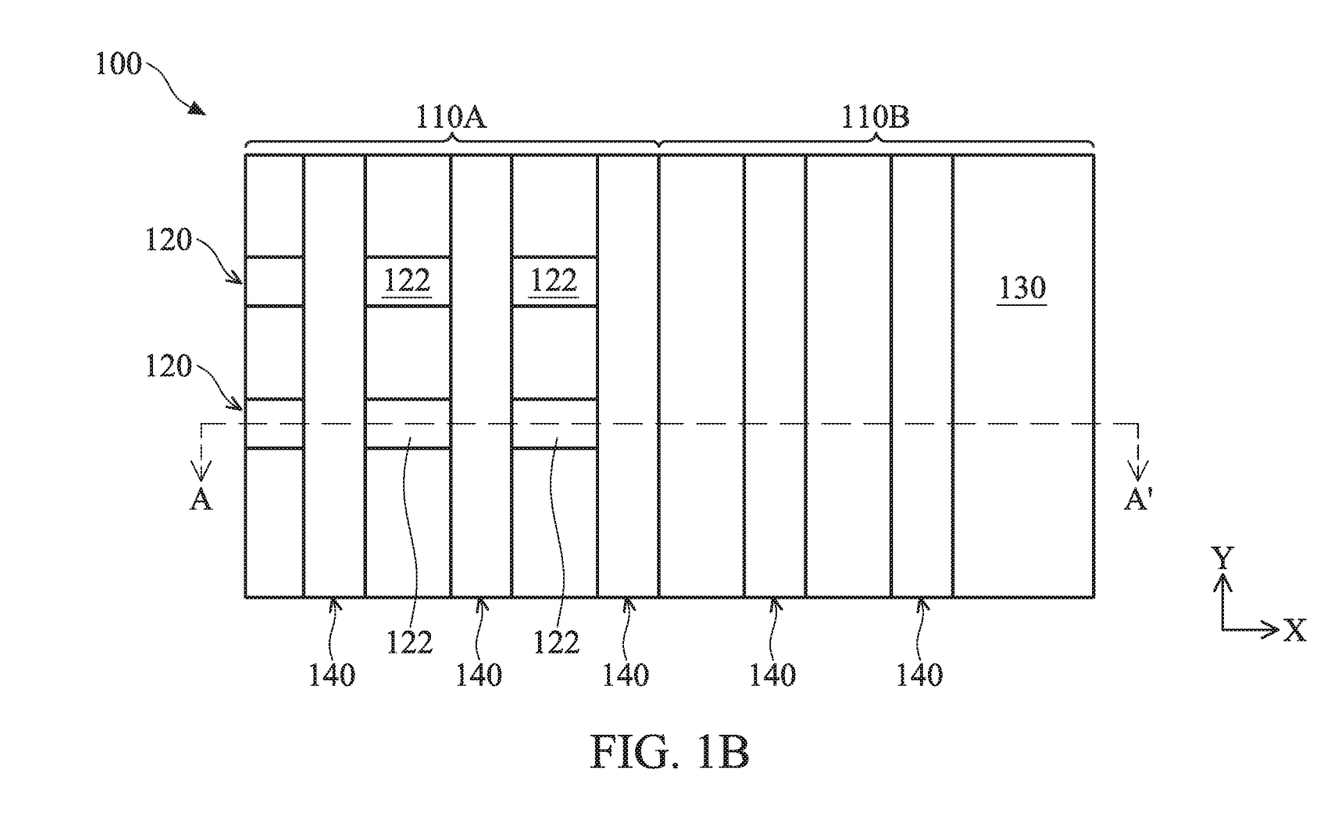
FIG. 1B is a planar top view of an embodiment of a semiconductor device according to various aspects of the present disclosure.
Figure 2:
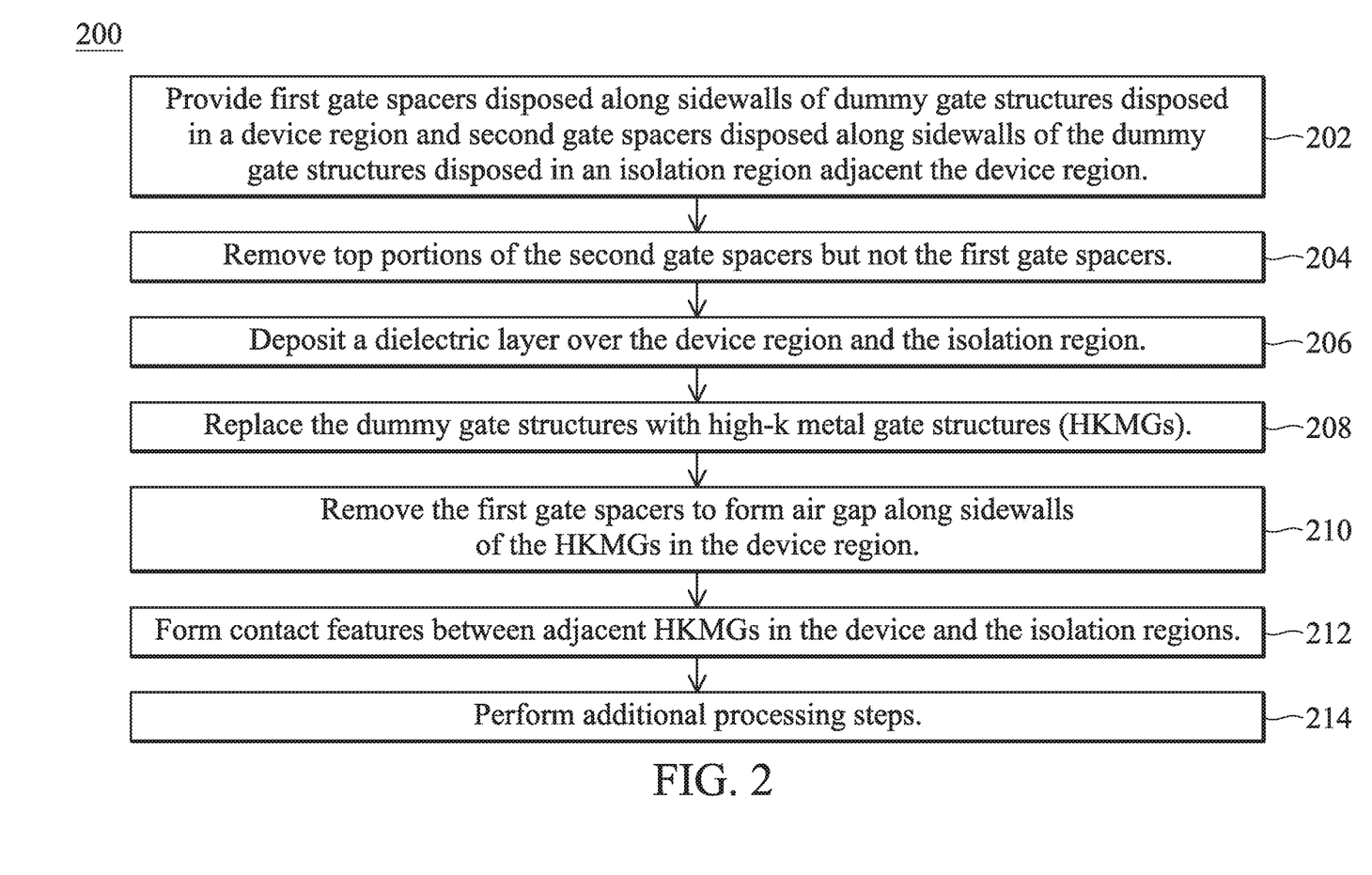
FIG. 2 is a flow chart of a method of fabricating a semiconductor device according to various aspects of the present disclosure.

FIGS. 1A and 1B illustrate a three-dimensional perspective view and a top view, respectively, of a portion of a semiconductor structure 100. FIG. 2 is a flow chart of a method 200 for processing an embodiment of the semiconductor structure 100 according to various aspects of the present disclosure. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the method. Intermediate steps of the method 200 is described below in conjunction with FIGS. 3-9, which each illustrates a cross-section view of a portion of the semiconductor structure 100 taken along a dashed line AA' as shown in FIGS. 1A and 1B, according to various aspects of the present disclosure.

The semiconductor structure 100 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the semiconductor structure 100 as illustrated is a three-dimensional FinFET device, the present disclosure may also provide embodiments for fabricating planar FET devices.

Referring collectively to FIGS. 1A-3, the method 200 at operation 202 provides the semiconductor structure 100. Referring to FIG. 1A, the semiconductor structure 100 may include a substrate 110 having three-dimensional active regions, hereafter referred to as fins, 120 formed thereon, dummy gate structures 140 formed over and engaging the fins 120 on three sides in a channel region of each fin 120, isolation structures 130 formed over the substrate 110 separating various components of the semiconductor structure 100, source/drain (S/D) features 122 formed over the fins 120. Referring to FIG. 1B, the dummy gate structures 140 are oriented lengthwise along the Y direction and separated from each other along a direction of the fin length, i.e., the X direction. Specifically, some dummy gate structures 140 are disposed in a device region (alternatively referred to as an active region) 110A, where the dummy gate structures 140 engage the fins 120 in a channel region of each fin 120. Other dummy gate structures 140 are disposed in an isolation region 110B disposed adjacent to the device region 110A, where the isolation region 110B includes the isolation structure 130. In many embodiments, the device region 110A provides multiple FinFET devices following formation of metal gate structures.

As depicted herein, the semiconductor structure 100 may include multiple fins 120 oriented lengthwise along the X direction and multiple dummy gate structure 140 oriented lengthwise along the Y direction, i.e., generally perpendicular to the fins 120. In many embodiments, as will be discussed in detail below, the semiconductor structure 100 includes additional features such as gate spacers disposed along sidewalls of the dummy gate structures 140, hard mask layer(s) disposed over the dummy gate structures 140, and numerous other features. For purpose of simplicity, intermediate steps of the method 200 are hereafter described with reference to cross-sectional views (FIGS. 3-9) of the semiconductor structure 100 taken along the dashed line AA' as illustrated in FIGS. 1A-1B.

The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonideor, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof.

In some embodiments where the substrate 110 includes FETs, various doped regions, such as source/drain regions, are formed in or on the substrate 110. The doped regions may be doped with p-type dopants, such as phosphorus or arsenic, and/or n-type dopants, such as boron or indium, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

The fins 120 may be fabricated using suitable processes including photolithography and etch processes. The photolithography process may include forming a photoresist layer (resist) overlying the substrate 110, exposing the resist to a pattern, performing post-exposure bake processes, and developing the resist to form a masking element (not shown) including the resist. The masking element is then used for etching recesses into the substrate 110, leaving the fins 120 on the substrate 110. The etching process may include dry etching, wet etching, reactive ion etching (RIE), and/or other suitable processes.

Numerous other embodiments of methods for forming the fins 120 may be suitable. For example, the fins 120 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 130 may include silicon oxide, silicon nitride, silicon oxynitride, fluoride-doped silicate glass (FSG), a low-k dielectric material, and/or other suitable materials. The isolation structures 130 may include shallow trench isolation (STI) features. In one embodiment, the isolation structures 130 are formed by etching trenches in the substrate 110 during the formation of the fins 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers. In some embodiments, such as those depicted in FIGS. 3-9, forming the fins 120 inadvertently removes a portion of the isolation structures 130, such that a top surface of the isolation structures 130 assumes a concave configuration. In other words, in the view depicted herein, a center thickness $t_c$ of the isolation structures 130 is less than an edge thickness $t_e$ of the isolation structures 130. In one example, a ratio of $t_c$ to $t_e$ may be about 0.85. Of course, the present disclosure is not limited to this configuration.

In the device region 110A, the dummy gate structures 140 engage the fins 120 in the channel region of each fin 120. In many embodiments, as will be discussed in detail below, portions of the dummy gate structure 140 will be replaced with a high-k metal gate structure (HKMGs) after other components, such as S/D features 122, of the semiconductor structure 100 are fabricated. The dummy gate structure 140 includes at least a dummy gate electrode comprising polysilicon. Though not depicted herein, the dummy gate structure 140 may include additional material layers, such as an interfacial layer over the fins 120, a dielectric layer, a capping layer, other suitable layers, or combinations thereof. In the depicted embodiment, referring to FIG. 3, the dummy gate structures 140 disposed entirely in the device region 110A are referred to as dummy gate structures 140A, those disposed entirely on the isolation region 110B are referred to as dummy gate structures 140B, and the dummy gate structure 140 disposed at a boundary between the regions 110A and 110B is referred to as dummy gate structure 140C. In many embodiments, an edge of the dummy gate structure 140C substantially coincides with the boundary between the regions 110A and 110B along the Z direction.

Figure 3:
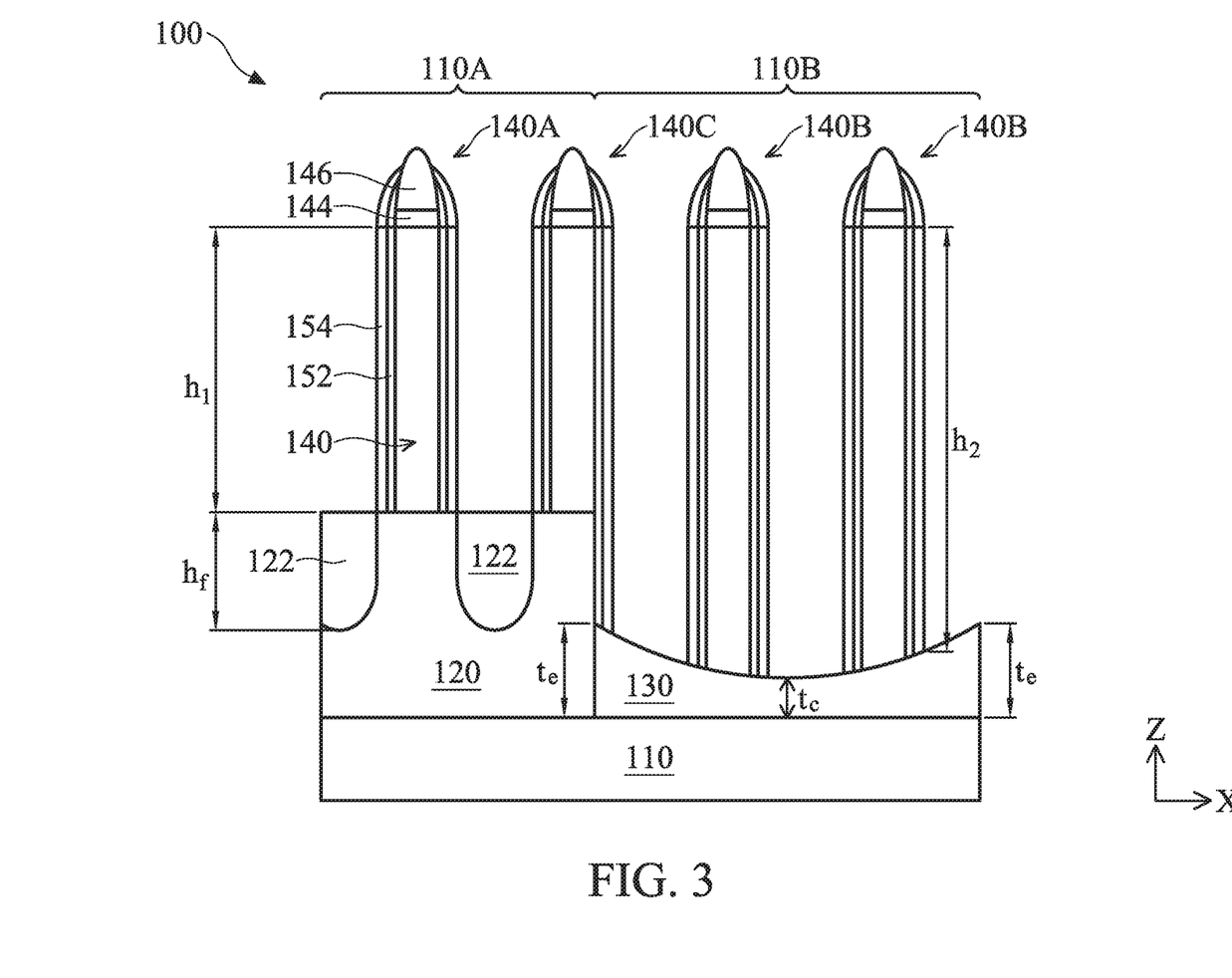
FIGS. 3, 4, 5, 6, 7, 8, and 9 are cross-sectional views of an embodiment of the semiconductor device of FIGS. 1A and 1B taken along dashed line AA' during intermediate steps of an embodiment of the method of FIG. 2 according to various aspects of the present disclosure.

In the depicted embodiment, referring to FIG. 3, the dummy gate structure 140 includes a hard mask layer 144 disposed over the dummy gate electrode and a hard mask layer 146 disposed over the hard mask layer 144. In some embodiments, the hard mask layers 144 and 146 are configured to protect the dummy gate electrode from subsequent operations of the method 200. The hard mask layers 144 and 146 may each include any suitable dielectric material, such as a nitrogen-containing dielectric material, an oxygen-containing dielectric material, other suitable materials, or combinations thereof. In the depicted embodiment, the hard mask layer 144 includes a nitrogen-containing dielectric material, such as silicon nitride or a metal nitride, and the hard mask layer 146 includes an oxygen-containing dielectric material, such as silicon oxide or a metal oxide.

The hard mask layers 144 and 146 and various material layers included in the dummy gate structure 140 may be formed by any suitable method, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), plasma enhanced CVD (PE-CVD), low-pressure CVD (LP-CVD), atomic layer CVD (AL-CVD), atmospheric pressure CVD (AP-CVD), other suitable methods, or combinations thereof. In one embodiment, the various layers of the dummy gate structure 140 are first deposited as blanket layers. The blanket layers are then patterned through a series of lithography and etching processes, thereby removing portions of the blanket layers and keeping the remaining portions over the isolation structures 130 and the fins 120 as the dummy gate structure 140.

In many embodiments, because a top surface of the fin 120 extends above a top surface of the isolation structures 130 (i.e., the fin height $h_f$ measured from a top surface of the isolation structure 130 is greater than $t_e$), the dummy gate structures 140 disposed in the isolation region 110B are taller than the dummy gate structures 140 disposed in the device region 110A, i.e., the height $h_2$ is greater than the height $h_1$ as depicted in FIG. 3.

Referring to FIG. 3, the semiconductor structure 100 further includes a gate spacer layer (or alternatively referred to as "gate spacer") 152 disposed along sidewalls of the dummy gate structures 140 and a gate spacer layer (or alternatively referred to as "gate spacer") 154 disposed over the gate spacer layer 152. In some embodiments, the gate spacer layer 152 may be omitted, such that the gate spacer layer 154 directly contacts the dummy gate structures 140. The gate spacer layers 152 and 154 have different compositions from each other and each includes a material different from the material(s) included in the dummy gate structure 140. In some embodiments, the gate spacer layers 152 and 154 may include silicon, oxygen, nitrogen, carbon. In one example, the gate spacer layer 152 may include carbon-doped silicon nitride. The gate spacer layers 152 and 154 may differ in composition. For example, the gate spacer layer 152 may include a greater amount of carbon than the gate spacer layer 154. In some embodiments, additional gate spacer layer(s) may be included between the dummy gate structures 140 and the gate spacer layer 154. The gate spacer layers 152 and 154 may each be formed by first depositing a blanket of spacer material over the semiconductor structure 100 by a method such as CVD, PVD, ALD, other suitable methods, or combinations thereof, and then performing an anisotropic etching process to remove portions of the spacer material to form the gate spacer layers 152 and 154.

Still referring to FIG. 3, the semiconductor structure 100 includes S/D features 122 disposed over the fins 120. The S/D features 122 may be formed by any suitable techniques, such as etching processes followed by one or more epitaxy processes. In one example, one or more etching processes are performed to remove portions of the fins 120 to form recesses (not shown) therein. A cleaning process may be performed to clean the recesses with a hydrofluoric acid (HF) solution or other suitable solution. Subsequently, one or more epitaxial growth processes are performed to grow epitaxial features in the recesses. Each of the S/D features 122 may be suitable for a p-type FinFET (e.g., a p-type epitaxial material) or alternatively, an n-type FinFET (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants.

Figure 4:
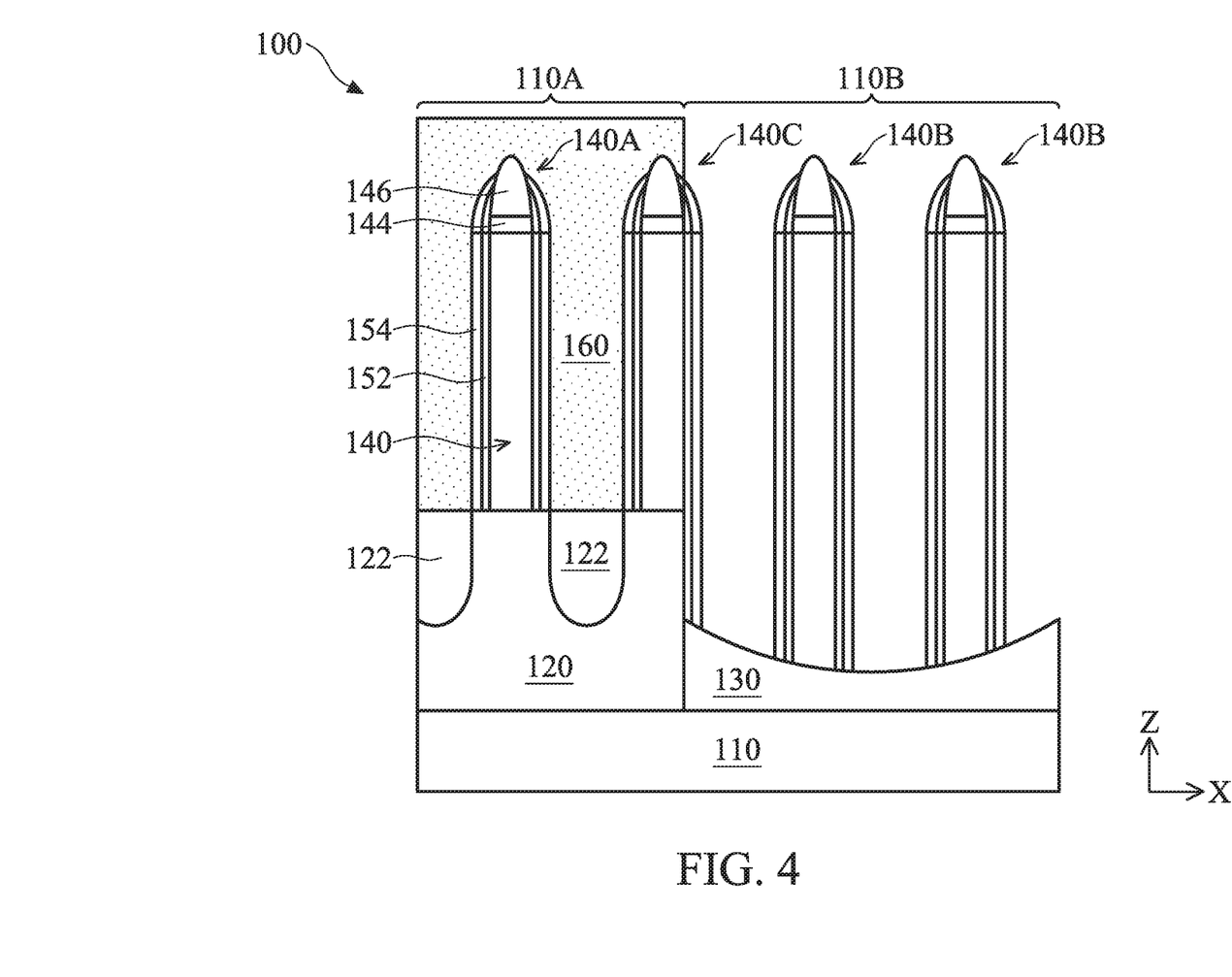
Figure 5:
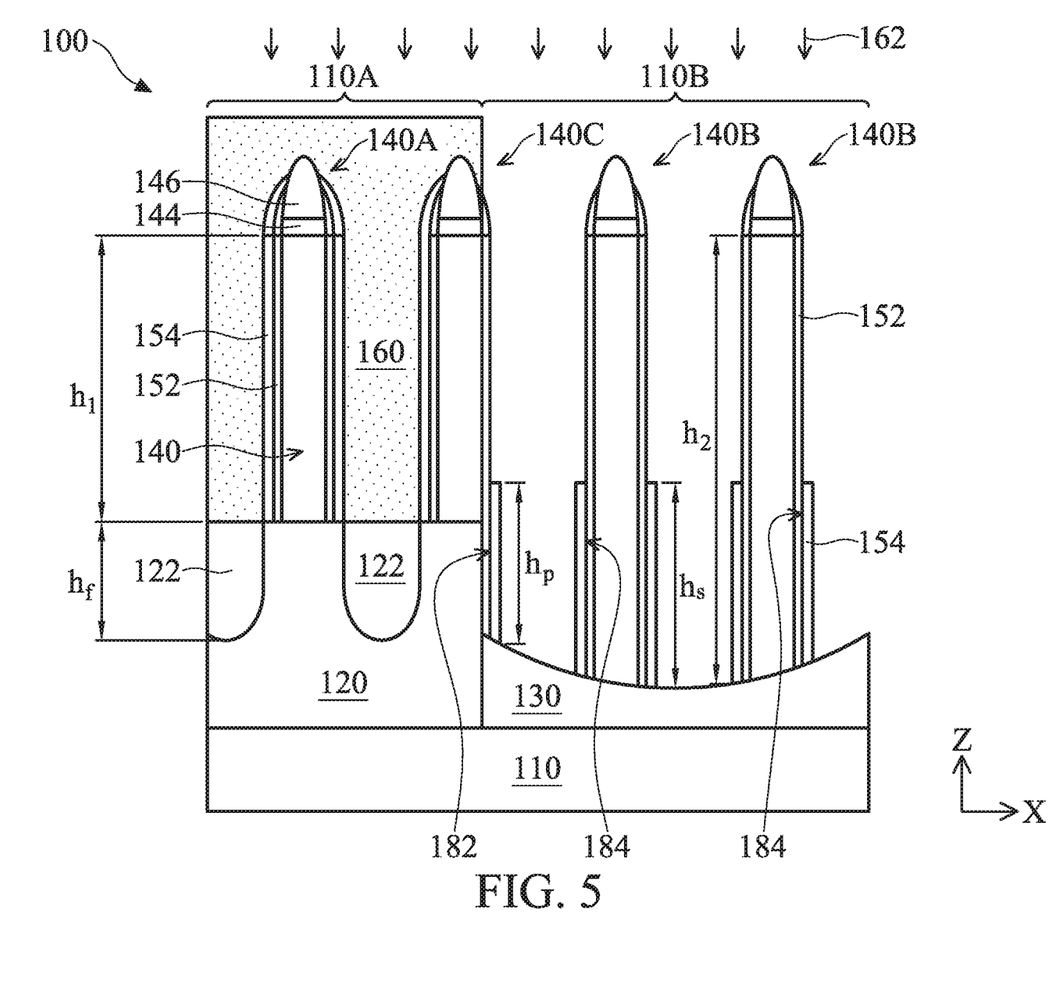

Now collectively referring to FIGS. 2, 4, and 5, the method 200 at operation 204 removes portions of the gate spacer layer 154 without substantially removing the gate spacer layer 152. Specifically, top portions of the gate spacer layer 154 are selectively removed from the isolation region 110B relative to the gate spacer layer 152, the hard mask layer 144, the hard mask layer 146, and the dummy gate structures 140. In some embodiments, the method 200 removes the top portions of the gate spacer layer 154 in a series of patterning and etching processes as discussed below.

Referring to FIG. 4, a patterned mask 160 is first formed over the device region 110A to expose the isolation region 110B. Forming the patterned mask 160 may include forming a bottom layer, such as a bottom anti-reflective coating (BARC), over the semiconductor structure 100, and subsequently forming a resist layer (e.g., a photoresist layer; not depicted) over the bottom layer. The resist layer may be patterned using any suitable method to form the patterned mask 160 that exposes the isolation region 110B. After the patterning process, the bottom layer may then be removed from the isolation region 110B by any suitable method, such as a wet cleaning process utilizing any suitable solvent (e.g., high-temperature sulfuric peroxide mix (HTSPM), dilute hydrofluoric acid (DHF), other suitable solvents, or combinations thereof). In many embodiments, an edge of the patterned mask 160 substantially coincides with an edge of the fin 120 along the Z direction. In other words, as depicted in FIG. 4, the gate spacer layers 152 and 154 on the sidewalls of the dummy gate structure 140C extend downward along the Z direction to contact the isolation structures 130, such that they are exposed by the patterned mask 160.

Referring to FIG. 5, the method 200 at operation 204 performs an etching process 162 to selective remove top portions of the gate spacer layer 154 relative to the gate spacer layer 152, the hard mask layer 144, the hard mask layer 146, and the dummy gate structures 140. In other words, the etching of the gate spacer layer 154 is subjected to a higher etch rate relative to the gate spacer layer 152, the hard mask layer 144, the hard mask layer 146, and the dummy gate structures 140. In some embodiments, the etching process 162 is tuned by controlling etching power, duty cycle, duration of etching time, and/or ratio of multiple etchants, such that a height of the remaining portions of the gate spacer layer 154 may be adjusted according to specific design requirements. In some embodiments, the etching process 162 may implement any suitable etching process, such as a dry etching process, a wet etching process, RIE, other suitable processes, or combinations thereof. In an example embodiment, the etching process 162 implements a dry etching process using one or more suitable etchant, such as a fluorine-containing etchant, a chlorine-containing etchant, other suitable etchants, or combinations thereof. In some embodiments, the etching process 162 is implemented anisotropically along the Z direction. Following the etching process 162, the patterned mask 160 is removed from the semiconductor structure 100 by any suitable process, such as plasma ashing or resist stripping.

In the depicted embodiment, remaining portions 184 of the gate spacer layer 154 are disposed on both sidewalls of the dummy gate structures 140B, while a remaining portion 182 of the gate spacer layer 154 is disposed only on one of the two sidewalls of the dummy gate structure 140C. In many embodiments, after performing the etching process 162, a height $h_s$ of the remaining portions 184 is at least about 30% the height $h_2$ of the dummy gate structures 140B, and a height $h_p$ of the remaining portion 182 is greater than the fin height $h_f$. In other words, no more than about 70% of the gate spacer layer 154 disposed on sidewalls of the dummy gate structures 140B and 140C may be removed by the etching process 162, and a top surface of the remaining portions 182 and 184 are above the top surface of the fin 120. In further embodiments, the height $h_p$ may be less than the height $h_s$. In one example, a ratio of $h_p$ to $h_s$ is about 0.9 In a further example, a difference between $h_p$ and $h_s$ is less than about 10 nm. Notably, the height $h_s$ is configured to be at least 30% of the height $h_2$ to ensure that the high-k metal gate structures (HKMG) to be formed in place of the dummy gate structures 140B in the isolation region 110B may not collapse during the gate replacement process as discussed in detail below. Of course, the percentages cited above are example average values as the dummy gate structures 140B disposed near the edge of the isolation structures 130 may be lower than those disposed near the center of the isolation structures 130 for reasons discussed in detail above. The height $h_s$ and $h_p$ may be controlled by tuning the etching time, power, duty cycle, duration, and/or ratio of different etchants of the etching process 162. For example, to control the height $h_p$ and $h_s$, the etching time may be adjusted based on the etching behavior of the gate spacer layer 154.

Figure 6:
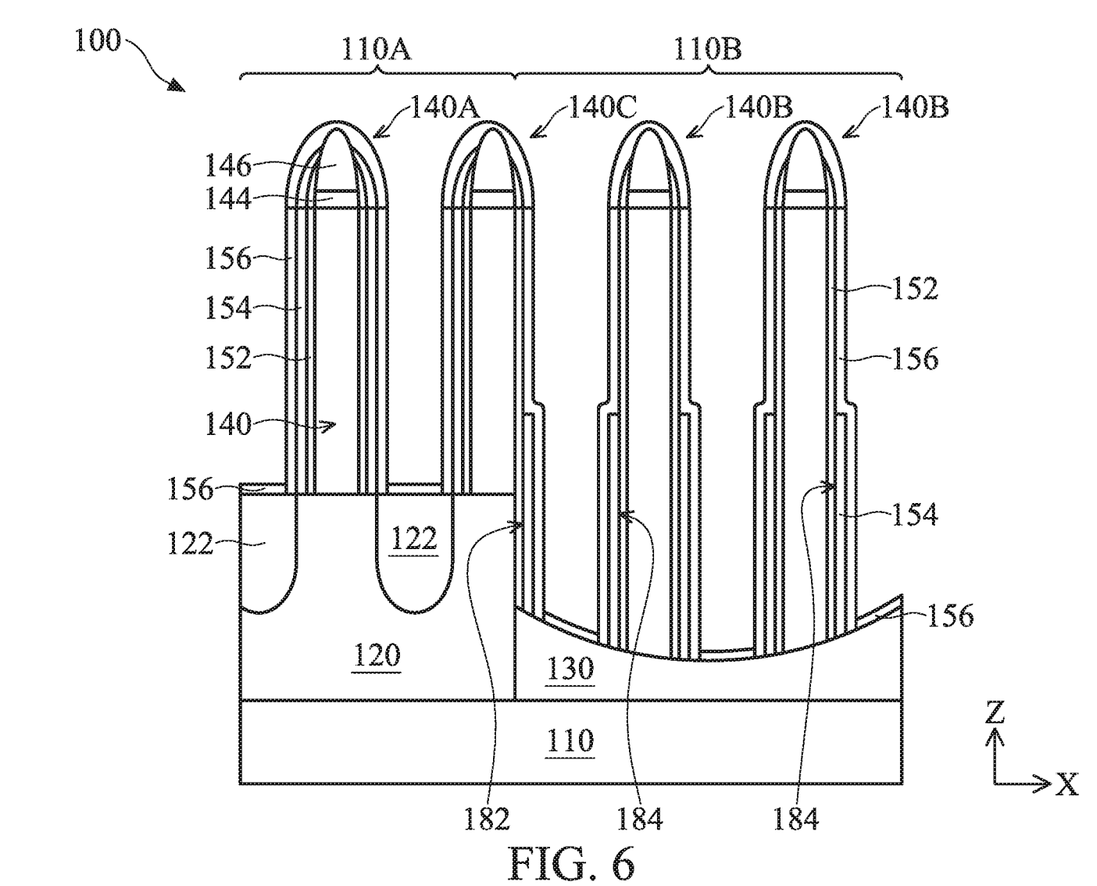

Referring to FIGS. 2 and 6, the method 200 at operation 206 deposits a dielectric layer 156 over the device region 110A and the isolation region 110B. In many embodiments, the method 200 deposits the dielectric layer 156 over the dummy gate structures 140, the fin 120, and the isolation structure 130, such that the dielectric layer 156 is formed conformally over the dummy gate structures 140 (i.e., the dummy gate structures 140A, 140B, and 140C). In some embodiments, the dielectric layer 156 is configured to protect the underlying structures from being damaged during subsequent processing steps and may be, for example, a contact etch-stop layer (CESL). The dielectric layer 156 may include any suitable dielectric material, such as a nitrogen-containing dielectric material, an oxygen-containing dielectric material, other suitable materials, or combinations thereof. In the depicted embodiment, the dielectric layer 156 includes a nitrogen-containing dielectric material, such as silicon nitride, carbon-doped silicon nitride, or a metal nitride. The dielectric material(s) included in the gate spacer layer 154 is different from the dielectric material(s) included in the dielectric layer 156, such that the gate spacer layer 154 may be etched relative to the dielectric layer 156 at a subsequent fabrication step. In some embodiments, the dielectric material(s) included in the dielectric layer 156 is similar to those included in the gate spacer layer 152. In many embodiments, the dielectric layer 156 may be formed by any suitable method, such as ALD, CVD, PVD, other suitable methods, or combinations thereof.

Figure 7:
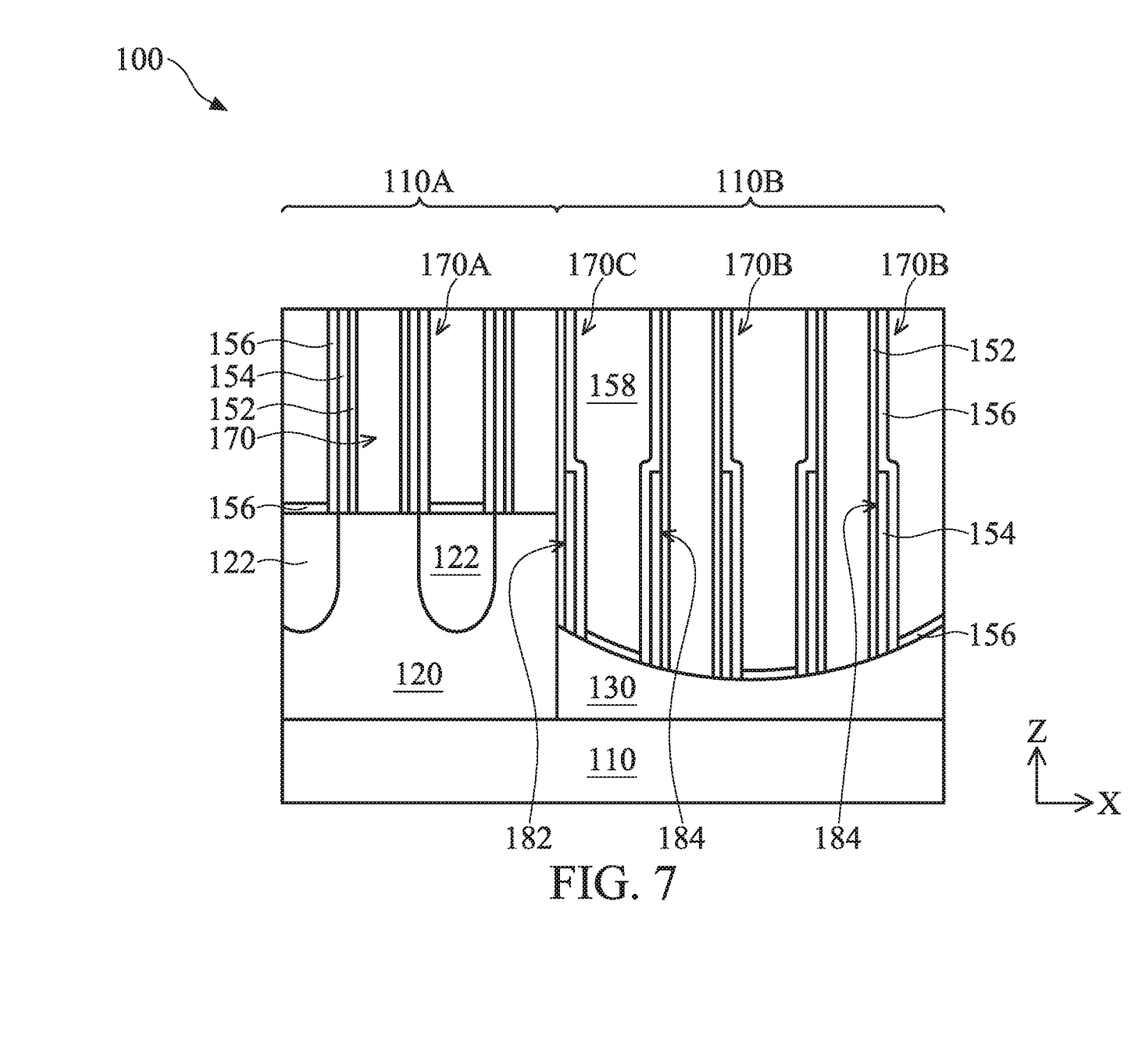

Referring to FIGS. 2 and 7, the method 200 at operation 208 replaces the dummy gate structures 140 with HKMGs 170. As depicted herein, the HKMGs 170 replacing the dummy gate structures 140A are referred to as HKMGs 170A, those replacing the dummy gate structures 140B are referred to as HKMGs 170B, and the HKMG replacing the dummy gate structure 140C is referred to as HKMG 170C. Before replacing the dummy gate structures 140 with HKMGs 170, the method 200 first deposits an interlayer dielectric (ILD) layer 158 over the semiconductor structure 100. The ILD layer 158 may include any suitable dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 158 may include a multi-layer structure having multiple dielectric materials. The ILD layer 158 may be deposited by a process such as, for example, CVD, PVD, ALD, flowable CVD (FCVD), spin-on-glass, other suitable methods. Subsequent to depositing the ILD layer 158, a planarization process such as CMP may be performed to remove excess ILD layer 158 as well as the hard mask layers 144 and 146, such that, among other things, top portions of the gate spacer layer 154 are exposed in the device region 110A but not in the isolation region 110B.

Thereafter, still referring to FIG. 7, the method 200 at operation 208 removes the dummy gate structures 140 to form gate trenches (not depicted) in both the device region 110A and the isolation region 110B. In some embodiments, forming the gate trenches includes performing an etching process that selectively removes the dummy gate structures 140 relative to the gate spacer layers 152 and 154, the dielectric layer 156, and the ILD layer 158. In other words, the etching process may be tuned such that the etching of the dummy gate structures 140 is subjected to a higher etch rate relative to the gate spacer layers 152 and 154, the dielectric layer 156, and the ILD layer 158. The etching process may be a dry etching process, a wet etching process, an RIE, other suitable methods, or combinations thereof. The dry etching process may use any suitable etchant, such as chlorine-containing gases, fluorine-containing gases, other etching gases, or combinations thereof. The wet etching solutions may include ammonium hydroxide ($NH_4OH$), hydrofluoric acid (HF) or diluted HF, deionized water, tetramethylammonium hydroxide (TMAH), other suitable wet etching solutions, or combinations thereof. In an example embodiment, a dry etching process may be implemented to remove the dummy gate structures 140.

Thereafter, the method 200 at operation 208 forms HKMGs 170 in the gate trenches to complete the gate replacement process. Each of the HKMGs 170 (i.e., 170A, 170B, or 170C) includes at least a high-k dielectric layer (e.g., having a dielectric constant greater than that of silicon oxide; not depicted) and a conductive electrode (not depicted) that further includes at least one work function metal layer and a bulk conductive layer. The high-k dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The work function metal layer may include a p-type or an n-type work function material, such as TiN, TaN, Ru, Mo, Al, WN, $ZrSi_2$, $MoSi_2$, $TaSi_2$, $NiSi_2$, WN, Ti, Ag, TaAl, TaAlC, TiAlN, TaC, TaCN, TaSiN, Mn, Zr, other suitable materials, or combinations thereof. The bulk conductive layer may include Cu, W, Al, Ru, Co, other suitable metals, or combinations thereof. Each of the HKMGs 170 may further includes additional material layers, such as an interfacial layer, a barrier layer, a hard mask layer, other suitable layers, or combinations thereof. Various material layers of the HKMG 170 may be formed by chemical oxidation, CVD, ALD, PVD, FCVD, plating, other suitable methods, or combinations thereof. A CMP process may be performed to remove excess materials from the HKMGs 170 so as to planarize a top surface of the semiconductor structure 100 following the gate replacement process.

Figure 8:
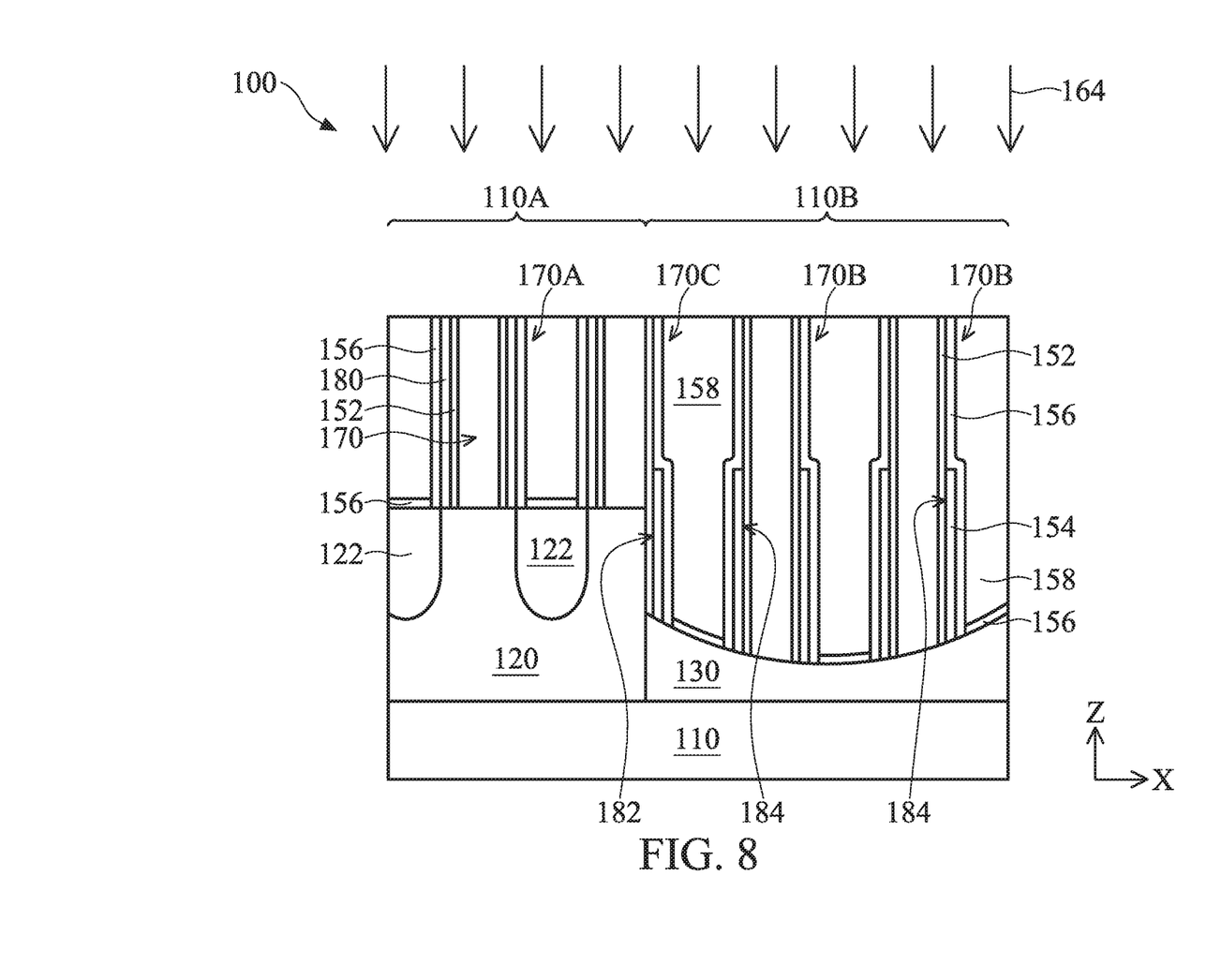

Referring to FIGS. 2 and 8, the method 200 at operation 210 removes the gate spacer layer 154 to form trenches (also referred to as air gaps) 180 along sidewalls of the HKMGs 170A in an etching process 164. In many embodiments, the method 200 selectively removes the gate spacer layer 154 relative to the gate spacer layer 152, the dielectric layer 156, the ILD layer 158, and the HKMGs 170. In other words, the etching of the gate spacer layer 154 is subjected to a higher rate relative to the gate spacer layer 152, the dielectric layer 156, the ILD layer 158, and the HKMGs 170. The etching process 164 may be tuned in a similar fashion as the etching process 162, such as by controlling etching power, duty cycle, duration of etching time, and/or ratio of multiple etchants. Specifically, the etching process 164 removes the gate spacer layer 154 disposed on both sidewalls of the HKMGs 170A and on one of the two sidewalls of the HKMG 170C, leaving behind the gate spacer layer 154 still disposed on the other one of the tw sidewalls of the HKMG 170C. Notably, because the dielectric layer 156 is deposited over the remaining portions 182 and 184 of the gate spacer layer 154, the gate spacer layer 154 disposed on both sidewalls of the HKMGs 170B and on one of the sidewalls of the HKMG 170C remain after the etching process 164 is performed. Stated in a different way, the dielectric layer 156 disposed in the isolation region 110B protects the underlying remaining portions 182 and 184 of the gate spacer layer 154 from being removed during the etching process 164. In some embodiments, reduction in capacitance of devices is ensured when the gate spacer layer 154 is removed completely formed sidewalls of the HKMGs 170 in the device region 110A.

In some embodiments, the etching process 164 may implement any suitable etching process, such as a dry etching process, a wet etching process, RIE, other suitable processes, or combinations thereof. In an example embodiment, the etching process 164 implements a dry etching process using one or more suitable etchant, such as a fluorine-containing etchant, a chlorine-containing etchant, other suitable etchants, or combinations thereof. In some embodiments, the etching process 164 is implemented anisotropically along the Z direction. The resulting air gap 180 has a height substantially similar (e.g., within ±2%) to a height of the HKMGs 170A and 170C but less than (e.g., about 50% to about 80%) a height of the fin 120 over which it is disposed.

Figure 9:
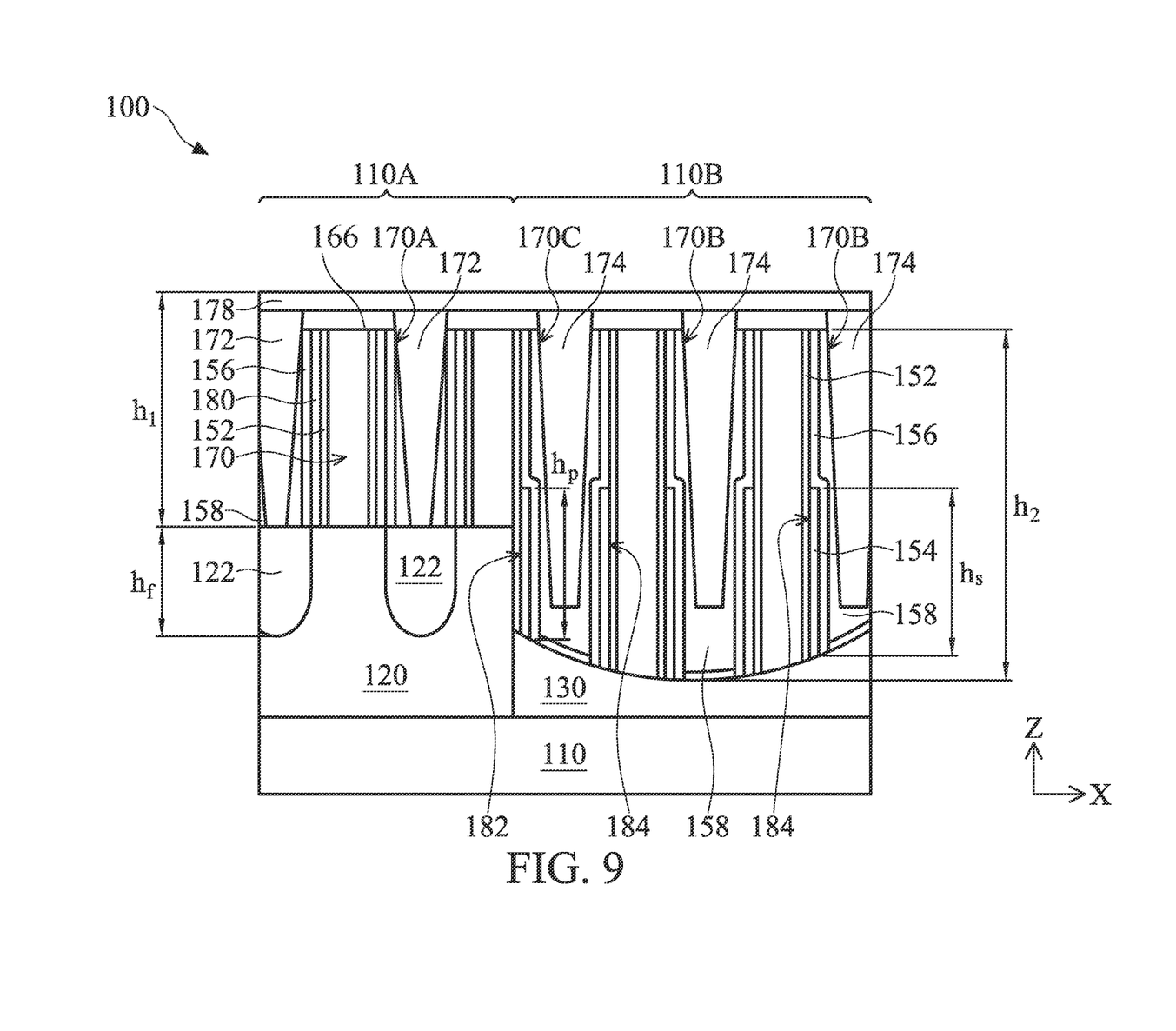

Referring to FIGS. 2 and 9, the method 200 at operation 212 forms contact features 172 in the device region 110A and contact features 174 in the isolation region 110B. Specifically, the contact features 172 are formed between adjacent HKMGs 170A and/or 170C, such that the contact features 172 are disposed over the S/D features 122 and electrically couple the S/D features 122 to conductive features (e.g., via contacts, conductive lines, etc.) formed hereafter. Thus, the contact features 172 may be referred to as device-level contacts. In the depicted embodiment, sidewalls of the contact features 172 are defined by the dielectric layer 156 and the ILD layer 158. However, the present disclosure is not limited to this configuration. For example, the ILD layer 158 may be absent along sidewalls of the contact features 172. In the isolation region 110B, the contact features 174 are formed between adjacent HKMGs 170B and 170C and between adjacent HKMGs 170B. In the depicted embodiment, a bottom surface and sidewalls of the contact features 174 are defined by the ILD layer 158, such that the bottom surface of the contact features 174 does not physically contact the dielectric layer 156 disposed in the isolation region 110B. However, the present disclosure is not limited to this configuration. For example, the bottom surface of the contact features 174 may be in contact with the dielectric layer 156.

The contact features 172 and 174 may each include any suitable conductive material, such as Cu, W, Al, Ru, Co, other suitable metals, or combinations thereof. The contact features 172 and 174 may be formed by a series of patterning and etching processes. For example, a patterned mask (not depicted) may be formed over the semiconductor structure 100 to expose regions between adjacent HKMGs 170 (e.g., adjacent HKMGs 170A, adjacent HKMGs 170B, and/or adjacent HKMGs 170C). Then, one or more etching process may be performed to remove at least portions of the ILD layer 158 to form contact trenches (not depicted) in which the contact features 172 and 174 may be formed. The etching process may include one or more dry etching process, wet etching process, RIE, other suitable methods, or combinations thereof. Thereafter, one or more suitable conductive material may be formed in the contact trenches using any suitable method, such as CVD, ALD, PVD, plating, other suitable methods, or combinations thereof. In the depicted embodiment, portions of the ILD layer 158 remain along sidewalls of the contact features 172. However, the present disclosure also provides embodiments in which the ILD layer 158 is completely removed from the contact trenches, such that no ILD layer 158 remains along sidewalls of the contact features 172. A CMP process may be performed to remove excess conductive material, such that a top surface of the semiconductor structure 100 may be planarized. Thereafter, an ILD layer 178 may be formed over the semiconductor structure 100 to accommodate further processing steps.

Furthermore, the height $h_s$ and the height $h_p$ of the remaining portions 184 and 182, respectively, remain substantially unchanged from the embodiment discussed in reference to FIG. 5. For example, the height $h_s$ is at least about 30% the height $h_2$ of the HKMGs 170B, and the height $h_p$ is greater than the fin height $h_f$.

In some embodiments, a dielectric layer 166 is formed over a top surface of the HKMGs 170, the gate spacer layer 152, the trenches (or air gaps) 180, the dielectric layer 156, and portions of the ILD layer 158 prior to performing the patterning and etching processes to form the contact features 172 and 174. The dielectric layer 166 may include any suitable dielectric material, such as a nitrogen-containing dielectric material, an oxygen-containing dielectric material, other suitable materials, or combinations thereof. In the depicted embodiment, the dielectric layer 166 includes a nitrogen-containing dielectric material, such as silicon nitride or a metal nitride. The dielectric material(s) included in the dielectric layer 166 may be the same or different from the dielectric material included in the dielectric layer 156, and may be formed by any suitable method, such as ALD, CVD, PVD, other suitable methods, or combinations thereof. In some embodiments, the dielectric layer 166 is formed at a lower processing temperature than other dielectric components of the semiconductor structure 100 due to it needing a lower thermal budget after the formation of the HKMGs 170, having a lower dielectric constant that other dielectric components (e.g., the dielectric layer 156), and exhibiting a relatively higher throughout during production. In one such example, the dielectric layer 166 may be formed at a temperature from about 300 degrees Celsius to about 450 degrees Celsius.

Subsequently, at operation 214, the method 200 performs additional processing steps to the semiconductor structure 100. For example, additional vertical interconnect features such as vias (e.g., vias configured to electrically connect with the contact features 172 and 174) and/or horizontal interconnect features such as lines, and multilayer interconnect features such as metal layers and interlayer dielectrics can be formed over the semiconductor structure 100. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof. For example, embodiments of the present disclosure provide methods for forming air gap on sidewalls of HKMGs in an active device region of a semiconductor structure but not in an isolation region (e.g., shallow-trench isolation structures) of the semiconductor structure. Many embodiments of the present disclosure improve performance of the HKMGs in the active device region is reduced by including the air gap in place or as a part of the gate spacer while maintaining structural integrity of HKMGs in the isolation region by excluding the air gap from the gate spacer.

In one aspect, the present disclosure provides a method that includes providing dummy gate structures disposed over an active region and over an isolation region adjacent the active region, a first gate spacer disposed along sidewalls of the dummy gate structures in the active region, and a second gate spacer disposed along sidewalls of the dummy gate structures in the isolation region, removing top portions of the second gate spacer, but not the first gate spacer, forming a first dielectric layer over the first gate spacer and remaining portions of the second gate spacer, replacing the dummy gate structures with metal gate structures after the forming of the first dielectric layer, removing the first gate spacer, after the replacing of the dummy gate structures, and forming a second dielectric layer over top surfaces of the metal gate structures and of the first dielectric layer.

In some embodiments, the first and the second gate spacers include the same composition.

In some embodiments, removing the top portions of the second gate spacer includes forming a patterned mask over the active region, thereby exposing the isolation region, and selectively etching the top portions of the second gate spacer relative to the dummy gate structures in the isolation region.

In some embodiments, removing the top portions of the second gate spacer includes removing no more than about 70% of a height of the second gate spacer.

In some embodiments, removing the first gate spacer includes forming an air gap disposed between sidewalls of the metal gate structures and the first dielectric layer in the active region, and wherein the forming of the second dielectric layer includes sealing the air gap.

In some embodiments, removing the first gate spacer includes selectively etching the first gate spacer relative to the first dielectric layer.

In some embodiments, the active region includes source/drain features disposed therein, and the method further includes, after the forming of the second dielectric layer, forming source/drain contacts over the source/drain features, where the source/drain contacts are disposed between the metal gate structures.

In another aspect, the present disclosure provides a semiconductor structure that includes a first metal gate structure disposed over a fin, a second metal gate structure disposed over an isolation region adjacent the fin, a gate spacer disposed on a bottom portion of sidewalls of the second metal gate structure, where a top portion disposed above the bottom portion of the second metal gate structure is free of the gate spacer, a first dielectric layer disposed on sidewalls of the first metal gate structure and on the sidewalls of the second metal gate structure, where the first dielectric layer directly contacts the gate spacer, a second dielectric layer disposed over the first metal gate structure and the first dielectric layer that seals an air gap disposed between the first dielectric layer and the sidewalls of the first metal gate structure, and S/D contacts disposed over S/D features, which are disposed over the fin.

In some embodiments, the gate spacer is a first gate spacer and the air gap is a first air gap, and the semiconductor structure further includes a third metal gate structure disposed over the fin and between the first and the second metal gate structures, the third metal gate structure including a first sidewall and a second sidewall, and a second gate spacer disposed over the isolation region and on a bottom portion of the second sidewall, where a top portion disposed above the bottom portion of the second sidewall is free of the second gate spacer, where the first dielectric layer is disposed on the first and the second sidewalls, where the first dielectric layer is separated from the first sidewall by a second air gap, and where the first dielectric layer directly contacts the second gate spacer. In a further embodiment, the second air gap and the first air gap have the same height.

In some embodiments, a height of the air gap is substantially similar to a height of the first metal gate structure. In some embodiments, a height of the air gap is less than a height of the fin.

In some embodiments, a top surface of the gate spacer is above a top surface of the fin. In some embodiments, a height of the gate spacer is about at least 30% of a height of the second metal gate structure.

In yet another aspect, the present disclosure provides a semiconductor structure that includes a high-k metal gate structure (HKMG) disposed over an isolation feature of a substrate, where a top portion disposed above the bottom portion of the sidewalls of the HKMG is free of the gate spacer layer, a gate spacer layer disposed on and directly contacting a bottom portion of sidewalls of the HKMG, a dielectric layer directly contacting the gate spacer layer and the top portion of the sidewalls of the HKMG, and a conductive feature disposed adjacent the HKMG in an interlayer dielectric (ILD) layer, where the ILD layer separates the conductive feature from the dielectric layer.

In some embodiments, the HKMG is a first HKMG, and the semiconductor structure further includes an active region disposed adjacent the isolation feature over the substrate and a second HKMG disposed over a fin in the active region, wherein sidewalls of the second HKMG are free of the gate spacer layer. In a further embodiment, a top surface of the gate spacer layer is above a top surface of the fin. In some embodiments, the dielectric layer is disposed on and separated from the sidewalls of the second HKMG by an air gap.

In still further embodiments, the semiconductor structure includes a third HKMG disposed over the active region, where a first sidewall and an upper portion of a second sidewall opposite the first sidewall of the third HKMG are free of the gate spacer layer, and where the gate spacer layer is disposed on a bottom portion of the second sidewall of the third HKMG.

In some embodiments, the dielectric layer is disposed over and separated from the first sidewall by an air gap, and the dielectric layer is disposed over and physically contacting the second sidewall.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a fin disposed over a substrate;
    an isolation region disposed adjacent to the fin;
    a first metal gate structure disposed over the fin, wherein a portion of the first metal gate structure along a lengthwise direction of the fin extends entirely over a top surface of the fin;
    source/drain (S/D) features disposed over the fin and adjacent to the first metal gate structure;
    a second metal gate structure, wherein, in a cross-sectional view cut through the fin and the isolation region, an entirety of the second metal gate structure is disposed directly over the isolation region and is not vertically overlapped with the fin;
    a gate spacer disposed on a bottom portion of sidewalls of the second metal gate structure, wherein a top portion disposed above the bottom portion of the sidewalls of the second metal gate structure is free of the gate spacer;
    a first dielectric layer disposed on sidewalls of the first metal gate structure and on the sidewalls of the second metal gate structure, wherein the first dielectric layer is separated from the sidewalls of the first metal gate structure by an air gap but directly contacts the top portion of the sidewalls of the second metal gate structure;
    a second dielectric layer disposed over the first metal gate structure and the first dielectric layer; and
    S/D contacts disposed over the S/D features.

2. The semiconductor structure of claim 1, wherein the gate spacer is a first gate spacer and the air gap is a first air gap, the semiconductor structure further comprising:
    a third metal gate structure disposed over the fin and between the first and the second metal gate structures, the third metal gate structure including a first sidewall and a second sidewall; and
    a second gate spacer disposed over the isolation region and on a bottom portion of the second sidewall, wherein a top portion disposed above the bottom portion of the second sidewall is free of the second gate spacer, wherein the first dielectric layer is disposed on the first and the second sidewalls, wherein the first dielectric layer is separated from the first sidewall by a second air gap, and wherein the first dielectric layer directly contacts the second gate spacer.

3. The semiconductor structure of claim 1, wherein the air gap extends from a bottommost surface to a topmost surface of the first metal gate structure.

4. The semiconductor structure of claim 1, wherein a height of the air gap is less than a height of the fin.

5. The semiconductor structure of claim 1, wherein a top surface of the gate spacer is above a top surface of the fin.

6. The semiconductor structure of claim 1, wherein a height of the gate spacer is about at least 30% of a height of the second metal gate structure.

7. A semiconductor structure, comprising:
    an isolation feature disposed over a substrate;
    a high-k metal gate structure (HKMG), wherein an entirety of the HKMG is disposed directly over the isolation feature;
    a gate spacer layer disposed along a bottom portion of a sidewall of the HKMG, wherein a top portion of the sidewall of the HKMG is free of the gate spacer layer;
    a dielectric layer disposed over the top portion of the sidewall of the HKMG and across a top surface of the gate spacer, wherein a bottom portion of the dielectric layer is separated from the bottom portion of the sidewall of the HKMG by the gate spacer layer;
    an interlayer dielectric (ILD) layer disposed over the isolation feature; and a conductive feature disposed adjacent to the HKMG, wherein the ILD layer separates the conductive feature from the dielectric layer.

8. The semiconductor structure of claim 7, wherein the HKMG is a first HKMG, the semiconductor structure further comprising an active region disposed adjacent to the isolation feature over the substrate and a second HKMG disposed over a fin in the active region, wherein sidewalls of the second HKMG are free of the gate spacer layer.

9. The semiconductor structure of claim 8, wherein a top surface of the gate spacer layer is above a top surface of the fin.

10. The semiconductor structure of claim 8, wherein the dielectric layer is disposed on and separated from the sidewalls of the second HKMG by an air gap.

11. The semiconductor structure of claim 8, further comprising a third HKMG disposed over the active region, wherein a first sidewall and an upper portion of a second sidewall opposite the first sidewall of the third HKMG are free of the gate spacer layer, and wherein the gate spacer layer is disposed on a bottom portion of the second sidewall of the third HKMG.

12. The semiconductor structure of claim 11, wherein the dielectric layer is disposed over and separated from the first sidewall by an air gap, and wherein the dielectric layer is disposed over and directly contacting the second sidewall.

13. A semiconductor structure, comprising:
  a semiconductor fin;
  an isolation feature disposed adjacent to the semiconductor fin;
  a first metal gate structure disposed over the semiconductor fin, wherein a bottom surface of the first metal gate structure extends entirely over a top surface of the semiconductor fin;
  a second metal gate structure disposed entirely over the isolation feature;
  a spacer layer disposed along a bottom portion of a sidewall of the second metal gate structure, wherein a sidewall of the first metal gate structure and a top portion of the sidewall of the second metal gate structure are free of the spacer layer;
  an etch-stop layer (ESL) disposed along the sidewall of the first metal gate structure and the sidewall of the second metal gate structure, wherein the bottom portion of the sidewall of the second metal gate structure is separated from the ESL by the spacer layer; and
  an air gap disposed between the sidewall of the first metal gate structure and the ESL,
  wherein the air gap extends along the sidewall of the first metal gate structure to expose the semiconductor fin.

14. The semiconductor structure of claim 13, wherein the second metal gate structure has a first height measured from a top surface of the isolation feature and the spacer layer has a second height measured from the top surface of the isolation feature, and wherein the second height is at least about 30% of the first height.

15. The semiconductor structure of claim 13, wherein the spacer layer vertically extends beyond a top surface of the semiconductor fin.

16. The semiconductor structure of claim 13, wherein the spacer layer is a first spacer layer and the air gap is a first air gap, the semiconductor structure further comprising:
  a third metal gate structure disposed over the semiconductor fin, wherein the third metal gate structure includes a first sidewall over the isolation feature and a second sidewall over the semiconductor fin;
  a second spacer layer disposed along a bottom portion of the first sidewall, such that the bottom portion of the first sidewall is separated from the ESL by the spacer layer, wherein the second sidewall and a top portion of the first sidewall are free of the second spacer layer; and
  a second air gap disposed between the second sidewall and the ESL.

17. The semiconductor structure of claim 16, wherein the second spacer layer vertically extends beyond a top surface of the semiconductor fin.

18. The semiconductor structure of claim 13, further comprising:
  a source/drain (S/D) feature disposed over the semiconductor fin and adjacent to the first metal gate structure;
  an interlayer dielectric (ILD) layer disposed over the ESL;
  a first S/D contact disposed in the ILD layer over the S/D feature; and
  a second S/D contact disposed in the ILD layer over the isolation feature, wherein a bottom portion of the second S/D contact is separated from the isolation feature by the ILD layer.

19. The semiconductor structure of claim 13, wherein the spacer layer and the ESL differ in composition.

20. The semiconductor structure of claim 1, wherein the air gap vertically extends to expose a top surface of the fin.

* * * * *